United States Patent [19]

Gatechair et al.

[11] Patent Number: 4,707,432
[45] Date of Patent: Nov. 17, 1987

[54] FERROCENIUM/ALPHA-CLEAVAGE PHOTOINITIATOR SYSTEMS FOR FREE RADICAL POLYMERIZABLE COMPOSITIONS

[75] Inventors: Leslie R. Gatechair, Katonah; Gary M. Blumenstein, Mahopac, both of N.Y.; Peter J. Schirmann, Fairfield, Conn.

[73] Assignee: Ciba-Geigy Corporation, Ardsley, N.Y.

[21] Appl. No.: 779,343

[22] Filed: Sep. 23, 1985

[51] Int. Cl.⁴ .......................... G03C 1/68; G03C 1/64
[52] U.S. Cl. ..................................... 430/281; 430/914; 430/916; 430/923; 430/925; 430/325; 430/284; 522/22; 522/25; 522/12; 522/28; 522/29; 522/66
[58] Field of Search ....................... 522/22, 25, 12, 28, 522/29, 66; 430/281, 280, 914, 916, 923, 925, 325, 284

[56] References Cited

U.S. PATENT DOCUMENTS

| | | | |
|---|---|---|---|
| 4,245,029 | 1/1981 | Crivello | 430/281 X |
| 4,525,553 | 6/1985 | Rooney et al. | 526/131 X |
| 4,537,854 | 8/1985 | Crivello | 430/914 X |

FOREIGN PATENT DOCUMENTS

| | | | |
|---|---|---|---|
| 0011918 | 6/1980 | European Pat. Off. | 430/914 |
| 0109851 | 5/1984 | European Pat. Off. | 430/914 |

OTHER PUBLICATIONS

Herman Sikaufman and Joseph J. Falcetta, eds., *Introduction to Polymer Science and Technology: An SPE Textbook*, John Wiley & Sons, Inc, New York, N.Y., 1977, pp. 56–62.

Green et al, "Photocross-Linkable Resin Systems", *Journal of Macromolecular Science; Reviews of Macromolecular Chemistry*, C21(2), pp. 187–273, 1981–82.

*Primary Examiner*—John E. Kittle
*Assistant Examiner*—Cynthia Hamilton
*Attorney, Agent, or Firm*—Harry Falber

[57] ABSTRACT

A free radical polymerizable composition comprising a free radical polymerizable material and a photoinitiator system therefor comprising appropriate amounts of an alpha-cleavage or homolytic bond cleavage, photoinitiator and a ferrocenium salt, said composition being suitable for use in the preparation of protective layers and photographic images.

26 Claims, No Drawings

FERROCENIUM/ALPHA-CLEAVAGE PHOTOINITIATOR SYSTEMS FOR FREE RADICAL POLYMERIZABLE COMPOSITIONS

α-cleavage photoinitiators such as acetophenones and ketals, and ferrocenium salts have been known for their individual use in the curing of a wide variety of coating compositions. A key utility for such compositions has been in imaging systems. For example, European publication No. 94,914 describes a hardenable composition consisting of a material polymerizable by cationic polymerization, which contains a (π-arene)-metal complex salt as the initiator. The composition can be hardened directly by the action of heat or first irradiated to activate the initiator and then hardened by the action of heat. For complete hardening, however, the period of exposure must be relatively long, which is uneconomical. It is therefore desirable to increase the photosensitivity. It is also desirable to avoid thermal hardening after irradiation and to effect the hardening by means of radiation alone.

European Pat. No. 109,851 and European Pat. No. 152,377 have now revealed that the photosensitivity can be substantially increased by the simultaneous use of a sensitizer in conjunction with selected (π-arene)-metal complex salts. It has furthermore been disclosed in the latter publication that thermal hardening can be extensively avoided by the concomitant use of an oxidizing agent. These publications indicate that the combined systems are utilizable in cationic polymerizable compositions. The former publication is silent on the use of the combined systems in free radical polymerizable compositions while, as noted above relative to the second publication, oxidizing agents are required ingredients in order to effectively utilize the photoinitiator blends in free radical polymerizations.

It has now been determined that free radical curing agents such as acetophenones and benzylketals are greatly improved in photoreactivity by the addition of certain ferrocenium salts, notwithstanding that such salts show little if any independent activity in free radical polymerizations. Thus, the combined systems exhibit a significant improvement in cure, as measured by increased light sensitivity, in a variety of compositions useful in imaging systems or in other applications where greater sensitivity to visible light is required. It is further to be noted that such unexpected improvement in the free radical polymerizations is achieved in the absence of the oxidizing agent of the above noted European publication.

The present invention relates to a composition containing:

(a) a material polymerizable by free radical polymerization, and a photoinitiator blend of (b) at least one iron compound of the formula I

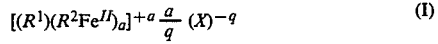

wherein
a is 1 or 2 and q is 1, 2 or 3,
X is halogen, nitrate, sulfate, phosphate, perchlorate or (LQm),
L is a divalent to heptavalent metal or non-metal,
Q is a halogen atom,
m is an integer corresponding to the sum of the values of L and q,
$R^1$ is an unsubstituted or substituted $\eta^6$-benzene, and
$R^2$ is an unsubstituted or substituted cyclopentadienyl anion, and (c) at least one α-cleavage or homolytic bond cleavage sensitizer for the compound of of the formula I.

As a mononuclear π-arene derived from benzene, $R^1$ in the formula I can be monosubstituted or polysubstituted by identical or different halogen atoms or $C_1$–$C_{12}$-alkyl, $C_2$–$C_{12}$-alkenyl, $C_2$–$C_{12}$-alkynyl, $C_1$–$C_8$-alkoxy, cyano, $C_1$–$C_{12}$-alkylthio, $C_2$–$C_6$-monocarboxylic acid ester, phenyl, $C_2$–$C_5$-alkanoyl or benzoyl groups.

The cyclopentadienyl anion $R^2$ can be monosubstituted or polysubstituted by identical or different $C_1$–$C_8$-alkyl, $C_2$–$C_8$-alkenyl, $C_2$–$C_8$-alkynyl, $C_2$–$C_6$-monocarboxylic acid ester, cyano, $C_2$–$C_5$-alkanoyl or benzoyl groups.

The abovementioned alkyl, alkoxy, alkylthio, monocarboxylic acid alkyl ester and alkanoyl substituents can be straight-chain or branched. Typical alkyl, alkoxy, alkylthio, monocarboxylic acid alkyl ester and alkanoyl substituents are, respectively, methyl, ethyl, n-propyl, isopropyl, n-butyl, sec.-butyl, tert.-butyl, n-pentyl, n-hexyl and n-octyl, methoxy, ethoxy, n-propoxy, isopropoxy, n-butoxy, n-hexyloxy and n-octyloxy, methylthio, ethylthio, n-propylthio, isopropylthio, n-butylthio, n-pentylthio and n-hexylthio, carboxylic acid methyl, ethyl, n-propyl, isopropyl, n-butyl and n-pentyl esters, and acetyl, propionyl, butyryl and valeroyl. The abovementioned alkyl, alkoxy, alkylthio and monocarboxylic acid alkyl ester groups preferably have 1 to 4 and especially 1 or 2 carbon atoms in the alkyl moieties and the abovementioned alkanoyl groups preferably have 2 or 3 carbon atoms. When $R^1$ is a substituted π-arene derived from benzene, it preferably contains one or two of the abovementioned substituents, especially chlorine or bromine atoms, methyl, ethyl, propyl, isopropyl, methoxy, ethoxy, cyano or carboxylic acid methyl or ethyl ester groups and acetyl groups.

Examples of suitable π-arenes derived from benzene are benzene, toluene, xylenes, ethylbenzene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, 1,2-dihydronaphthalene, 1,2,3,4-tetrahydronaphthalene, mesitylene, cumene, biphenyl, anisole and dodecylbenzene. Preference is given to benzene, toluene, xylene, cumene, mesitylene, chlorobenzene, chlorotoluene, anisole, dimethoxybenzene, biphenyl, dodecylbenzene or tetralin.

$R^2$ is preferably the cyclopentadienyl anion or a $C_1$–$C_4$-alkylated cyclopentadienyl anion, particularly the methylcyclopentadienyl anion.

In the formula I, a is preferably 1.

Examples of suitable metals or non-metals L are Sb, Fe, Sn, Bi, Al, Ga, In, Ti, Zr, Sc, V, Cr, Mn and Cu; lanthanides such as Ce, Pr and Nd; or actinides such as Th, Pa, U or Np. Suitable non-metals are especially B, P and As. L is preferably P, As, B or Sb, P being particularly preferred. The halogen atom Q is preferably Cl and particularly F.

In the formula I, q is preferably 1, m is preferably 6, Q is preferably F and L is preferably B, P, As or Sb.

Examples of complex anions $[LQ_m]^{-q}$ are $BF_4^-$, $PF_6^-$, $AsF_6^-$, $SbF_6^-$, $FeCl_4^-$, $SnCl_6^{2-}$, $SbCl_6^-$ and $BiCl_6^-$. The particularly preferred complex anions are $SbF_6^-$, $BF_4^-$, $AsF_6^-$ and $PF_6^-$.

The compounds of the formula I are known or can be prepared by analogous processes.

The α-cleavage or homolytic bond cleavage photoinitiators function by photoexcitation, generally the absorption of actinic radiation, producing the excited singlet state which is believed to undergo inter-system crossing to form a more chemically reactive excited triplet state. Without being limiting to the instant invention, the suggested mechanism has, for example, the aromatic carbonyl compounds commonly undergoing carbon-carbon bond homolytic scission in their excited triplet state resulting in the formation of the benzoyl radical (Ar-(C:O).) and the resulting alkyl radical (.CR$_1$, R$_2$, R$_3$). Such photochemistry is well known in the art and in frequently referred to as Norrish Type 1 Cleavage. Applicable photoinitiators include (1) acetophenones and ketals corresponding to the formula

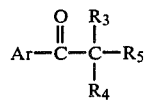

wherein Ar is $C_6-C_{14}$ aryl which is unsubstituted or substituted by halogen, CN, OH, $C_1-C_{12}$ alkyl, —Oalk, —Ophenyl, —Salk, —SCH$_2$CH$_2$OH, —Sphenyl, —SO$_2$alk, —SO$_2$phenyl, —COOalk, —SO$_2$NH$_2$, —SO$_2$NHalk, —SO$_2$N(alk)$_2$, —NHalk, —N(alk)$_2$, —NHCOalk or —NHCO-phenyl, or represents thienyl, pyridyl, furyl, indanyl or tetrahydronaphthyl, and alk represents a lower alkyl radical of 1 to 4 carbon atoms, R$_3$ is OH, $C_1-C_8$ alkyl which is unsubstituted or substituted by —OH, Oalk, $C_2-C_8$acyloxy, —COOalk or —CN, or is $C_3-C_4$alkenyl, $C_5-C_6$cycloalkyl, $C_7-C_9$phenylalkyl, or —OR$_6$ wherein R$_6$ is $C_1-C_8$ alkyl which is unsubstituted or substituted by —OH, Oalk, $C_2-C_8$ acyloxy, —COOalk, —CN or phenyl, or $C_6$ aryl; and R$_4$ has one of the meanings assigned to R$_3$, $C_2-C_8$ alkenylene or together with R$_3$ represents $C_2-C_8$ alkylene or $C_3-C_9$oxaor azaalkylene; and R$_5$ is hydrogen, OH, $C_1-C_8$ alkyl, $C_6-C_{14}$ aryl, $C_5-C_8$ cycloalkyl or morpholino.

Such compounds are known having been disclosed, for example, in U.S. Pat. No. 3,715,293, U.S. Pat. No. 3,728,377, U.S. Pat. No. 4,284,485 and U.S. Pat. No. 4,318,791.

Preferred compound have R$_3$ and R$_4$ as —OR$_6$, R$_6$ as $C_1-C_4$ alkyl and R$_5$ as phenyl; or R$_3$ and R$_4$ combining to form $C_2-C_8$ alkylene, preferably cyclohexylene, and R$_5$ as —OH or phenyl.

Typical alkyl groups include methyl, ethyl, propyl, isobutyl, t-butyl, pentyl, neopentyl, hexyl, heptyl, octyl, 2-ethylhexyl; aryl groups include phenyl, naphthyl, anthracyl, tolyl, xylyl, methoxyphenyl, halophenyl, hydroxyphenyl, nitrophenyl and carboethoxyphenyl; and cycloalkyl groups include cyclopentyl, methylcyclopentyl, dimethylcyclopentyl, ethylcyclopentyl, cyclohexyl, methylcyclohexyl, cycloheptyl, bicycloheptyl, cyclooctyl, bicyclooctyl.

Illustrative thereof are
2,2-dimethoxyacetophenone
2,2-dimethoxy-2-phenylacetophenone
2,2-diethoxyacetophenone
2,2-dibutoxyacetophenone
2,2-dihexoxyacetophenone
2,2-di(2-ethylhexoxy)acetophenone
2,2-diphenoxyacetophenone
2,2-ditolyloxyacetophenone
2,2-di(chlorophenyl)acetophenone
2,2-di(nitrophenyl)acetophenone
2,2-diphenoxy-2-phenylacetophenone
2,2-dimethoxy-2-methylacetophenone
2,2-dipropoxy-2-hexylacetophenone
2,2-diphenoxy-2-ethylacetophenone
2,2-dimethoxy-2-cyclopentylacetophenone
2,2-dipentoxy-2-cyclohexylacetophenone
2,2-di(2-ethylhexyl)-2-cyclopentylacetophenone
2,2-diphenoxy-2-cyclopentyl-acetophenone
2,2-di(nitrophenoxy)-2-cyclohexylacetophenone
2,2-dimethyl-2-hydroxyacetophenone
2,2-diethoxy-2-phenylacetophenone
2,2-diphenethyloxy-2-phenylacetophenone
2,2-(2-butenediyloxy)-2-phenylacetophenone
2,2-dimethyl-2-morpholino-(p-thiomethyl)acetophenone
1-hydroxycyclohexyl phenyl ketone.

(2) Aryl glyoxalates, for example, corresponding to the formula

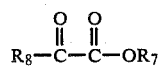

wherein R$_7$ is a straight or branched chain hydrocarbon of from 1-10 carbon atoms, aryl, aralkyl or mono-, di- or trialkylsilyl and R$_8$ is aryl of 6 to 14 carbon atoms, phenyl or mono-, di- or polysubstituted phenyl with substituents selected from the group consisting of alkyl, alkoxy, aryloxy, alkylthio, arylthio and halogen.

In the foregoing definitions the term "straight or branched chain hydrocarbon of from 1 to 10 carbon atoms" refers to acyclic hydrocarbon groups which may contain unsaturated carbon-to-carbon bonds. The term "aryl", which unmodified indicates an aromatic hydrocarbon of 6 carbon atoms while "aralkyl" refers to a 6 carbon aromatic hydrocarbon containing a straight chain saturated hydrocarbon substituent of from 1 to 3 carbon atoms and being ethereally bonded to the carbonyl group thereby. The alkyl groups bonded to silicon are lower alkyl of from 1 to 3 carbon atoms. The term "aryl of from 6 to 14 carbon atoms" refers to mono- or polycyclic aromatic substituents such as phenyl, biphenyl, naphthyl, anthracyl, tolyl, xylyl, methoxyphenyl, nitrophenyl, etc. Such compounds are disclosed in U.S. Pat. No. 4,038,164 and U.S. Pat. No. 4,519,883.

(3) Acylphosphine oxides, for example, corresponding to the formula

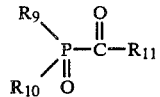

wherein R$_9$ is alkyl of 1 to 6 carbon atoms, cycloalkyl of 5 or 6 ring carbon atoms, aryl which is unsubstituted or substituted by halogen, alkyl or alkoxy, or a S-containing or N-containing five-membered or six-membered heterocyclic radical, R$_{10}$ has one of the meanings of R$_9$ but R$_9$ and R$_{10}$ may be identical or different, or is alkoxy, aryloxy or aralkoxy, or R$_9$ and R$_{10}$ together form a ring, and R$_{11}$ is tertiary alkyl of 4 to 18 carbon atoms or tertiary cycloalkyl of 5 or 6 ring carbon atoms, or is a cycloalkyl, aryl or 5-membered or 6-membered heterocyclic radical which contains substituents A and B at least in the two positions ortho to the carbonyl group, A and B being identical or different and each being alkyl, alkoxy, alkoxyalkyl, alkylthio, cycloalkyl, aryl or halogen.

The phrase "which contains substituents A and B in the two positions ortho to the carbonyl group" means that the substituents A and B are bonded to the two ring carbon atoms, capable of substitution, which are adjacent to the point of attachment of the carbonyl group. This means that the α-naphthyl radical contains the substituents A and B at least in the 2- and 8-positions and the β-naphthyl radical at least in the 1- and 3-positions. In the cyclohexyl radical, the substituents A and B are in the 2- and 6-positions, and in the cyclopentyl radical in the 2- and 5-positions.

Examples of acylphosphine oxide compounds are acylphosphine oxides and acylphosphinic acid esters. The following details may be noted with respect to the above noted formula.

$R_9$ may be straight-chain or branched alkyl of 1 to 6 carbon atoms, e.g. methyl, ethyl, i-propyl, n-propyl, n-butyl, amyl or n-hexyl, cycloalkyl, cyclopentyl and cyclohexyl, aryl, e.g. phenyl and naphthyl, halogen-substituted aryl, e.g. monochlorophenyl and dichlorophenyl, alkyl-substituted aryl, e.g. methylphenyl, ethylphenyl, isopropylphenyl, tert.-butylphenyl and dimethylphenyl, alkoxy-substituted aryl, e.g. methoxyphenyl, ethoxyphenyl and dimethoxyphenyl, or a S-containing or N-containing five-membered or six-membered heterocyclic radical, e.g. thienyl or pyridyl, $R_{10}$ may have one of the meanings of $R_9$ and may also be alkoxy, in particular of 1 to 6 carbon atoms, e.g. methoxy, ethoxy, i-propoxy, butoxy or ethoxyethoxy, or aryloxy, e.g. phenoxy, methylphenoxy, or aralkoxy, e.g. benzyloxy, and $R_9$ and $R_{10}$ may be joined to form a ring as, for example, in acylphosphonic acid o-phenylene esters.

$R_{10}$ can be, for example, cycloalkyl, phenyl or naphthyl, or a 5-membered or 6-membered heterocylic radical, in particular containing S, N or O in the ring, e.g. furyl, pyrrolyl, thienyl, pyranyl or pyridyl, which contains the substituents A and B at least in the two positions ortho to the carbonyl group. Examples of suitable substituents A and B are linear or branched alkyl, in particular of 1 to 6, preferably 1 to 4, carbon atoms, e.g. methyl, ethyl, propyl, iso-propyl, butyl, isobutyl and tert.-butyl; unsubstituted or substituted cycloalkyl, e.g. cyclohexyl, unsubstituted or substituted aryl, e.g. phenyl or tolyl, alkoxy and alkylthio, in particular of 1 to 6, preferably of 1 to 4, carbon atoms, e.g. methoxy, ethoxy, propoxy, iso-propoxy, n-butoxy, methylthio, ethylthio, propylthio, iso-propylthio, n-butylthio, sec.-butylthio and tert.-butylthio; alkoxyalkyl, in particular of 2 to 12, preferably of 2 to 8, carbon atoms, e.g. 2-methoxyethyl or tert.-butoxy-2-propyl; and halogen, especially chlorine or bromine.

Examples thereof are methyl isobutyryl-methylphosphinate, methyl isobutyryl-phenylphosphinate, methyl pivaloyl-phenylphosphinate, methyl 2-ethylhexanoyl-phenylphosphinate, isopropyl pivaloyl-phenylphosphinate, methyl p-toluyl-phenylphosphinate, methyl o-toluylphenylphosphinate, methyl 2,4-dimethylbenzoyl-phenylphosphinate, methyl acryloyl-phenylphosphinate, isobutyryldiphenylphosphine oxide, 2-ethylhexanoyl-diphenylphosphine oxide, o-toluyl-diphenylphosphine oxide, p-tert.-butylbenzoyldiphenylphosphine oxide, 3-pyridylcarbonyl-diphenylphosphine oxide, acryloyldiphenylphosphine oxide, benzoyldiphenylphosphine oxide, vinyl pivaloyl-phenylphosphinate and adipoyl-bis-diphenylphosphine oxide.

Such compounds are disclosed in U.S. Pat. No. 4,265,723 and U.S. Pat. No. 4,292,152.

(4) Aromatic halonium salts for example of the formula

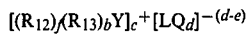

wherein $R_{12}$ is a monovalent aromatic organic radical, $R_{13}$ is a divalent aromatic organic radical, Y is a halogen cation, f is a whole number equal to 0 to 2, b is a whole number equal to 0 or 1, and the sum of f+b is equal to 2 or the valance of Y, $c = d - e$ e = valence of L and is an integer equal to 2 to 7 inclusive, d is an integer having a value greater than e.

Radicals included by $R_{12}$ can be the same or different, aromatic carbocyclic or heterocyclic radical having from 6 to 20 carbon atoms, which can be substituted with from 1 to 4 monovalent radicals selected from $C_1$–$C_8$alkoxy, $C_1$–$C_8$alkyl, nitro, chloro, etc. $R_{12}$ is more particularly, phenyl, chlorophenyl, nitrophenyl, methoxyphenyl, pyridyl, etc. Radicals included by $R_{13}$ are divalent radicals such as

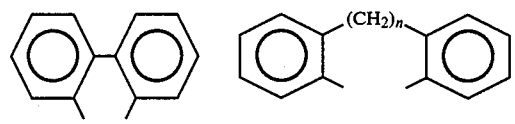

Complex anions included by $[LQ_d]^{-(d-e)}$ are, for example, $BF_4^-$, $PF_6^-$, $AsF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, etc. Metal or metalloids included by L are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc. actinides such as Th, Pa, U, Np, etc. and metalloids such as B, P, As, etc.

Such salts are disclosed, for example, in U.S. Pat. No. 4,307,177 and U.S. Pat. No. 4,310,469.

(5) Aromatic sulfonium salts, for example, of the formulae

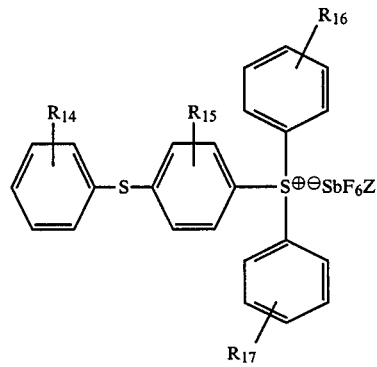

wherein Z is F or OH; $R_{14}$, $R_{15}$, $R_{16}$ and $R_{17}$ are each selected from H, lower alkyl(i.e. up to about 4 carbons), alkoxy (containing up to about 4 carbons), or halogen, or

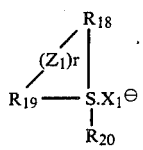

wherein $R_{18}$, $R_{19}$ and $R_{20}$, can be the same or different, provided that at least one of such groups is aromatic, and such groups can be selected from aromatic groups having 4 to 20 carbon atoms (e.g., substituted and unsubstituted phenyl, thienyl, and furanyl) and alkyl radicals having 1 to 20 carbon atoms. The term "alkyl" as used herein is meant to include substituted alkyl radicals (for example, substituents such as halogen, hydroxy, alkoxy, aryl). Preferably, $R_{18}$, $R_{19}$ and $R_{20}$ are each aromatic. $Z_1$ is selected from the group consisting of oxygen; sulfur;

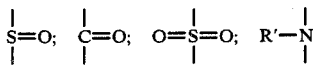

wherein $R^1$ is aryl (of 6 to 20 carbons, such as phenyl) or acyl (of 2 to 20 carbons, such as acetyl, benzoyl, etc.); a carbon-to-carbon bond; or

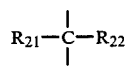

where $R_{21}$ and $R_{22}$ are selected from the group consisting of hydrogen, an alkyl radical having 1 to 4 carbon atoms, and an alkenyl radical having 2 to 4 carbon atoms; and r is zero or 1; and $X_1-$ is an anion.

Such salts are disclosed, for example in U.S. Pat. Nos. 4,069,054, 4,231,951 and 4,250,203.

The group (1) photoinitiators are preferred for purposes of this invention.

The blend of iron compound and photoinitiator are present in a combined concentration of from about 0.05–10.0%, by weight of the photopolymerizable material, preferably 0.2–2.5%, and most preferably 2%. The iron compound and the photoinitiator are present in weight ratios within the combination ranging from 6:1 to 1:4, preferably 1:1.

Suitable organic materials polymerizable by free radical polymerization are, in particular, monoethylenically or polyethylenically unsaturated compounds. Examples are: styrene, vinylpyridine, vinyl acetate, divinylbenzene, vinyl ether, acrylamide, methacrylamide, bisacrylamide, bismethacrylamide, unsaturated polyesters, especially those based on maleic acid, and various derivatives of butadiene, styrene, acrylics and polyesters. Preferred materials are the esters or amides of acrylic acid and/or methacrylic acid with linear or branched alcohols or polyols. Partial esters may also be used in the case of the polyols.

Examples of polyols are linear and branched alkylenediols such as ethylenediol, propylenediol, butylenediol, pentylenediol, hexylenediol and octylenediol, polyoxaalkylenediols such as diethylene glycol and triethylene glycol and polyethylene glycols with a molecular weight of 200 to 500, 1,4-dihydroxycyclohexane, 1,4-di(hydroxymethyl)cyclohexane, dihydroxybenzenes, hydroxymethylphenols, triols such as 1,2,3-trihydroxypropane, 1,2,4-trihydroxybutane and trimethylolpropane, pentaerythritol, dipentaerythritol and low-molecular polyesters with terminal hydroxyl groups. Other applicable polyols include those which may contain either epoxy prepolymers containing bisphenol-A-epoxide or its saturated equivalent or those containing aromatic or aliphatic urethane prepolymers such as those prepared from isophorone diisocyanate, methylene diphenyl diisocyanate, toluene diisocyanate and their saturated or unsaturated analogs.

Examples of suitable alcohols are methanol, ethanol, propanol, butanol, pentanol, hexanol, heptanol, octanol, 2-ethylhexanol, cyclohexanol, phenol and glycidol.

Preferred organic materials polymerizable by free radical polymerization are partial esters of epoxy resins and acrylic acid, methacrylic acid or a mixture of these acids, and acrylic acid esters and/or methacrylic acid esters of polyols.

The addition of epoxy or melamine or vinyl ether containing prepolymers may allow cationic polymerization to ensue thus achieving concurrent free radical and cationic polymerization during the same exposure process. Optionally, the cationic polymerization may proceed at a later period following a heat treatment. Such polymerizations are known to proceed as a dark reaction once acid is formed.

The hardenable compositions according to the invention can be obtained, for example, as homogeneous liquid mixtures or in the form of homogeneous or unhomogeneous glasses. Homogeneous glass-like products can be obtained in a manner known per se, for example by the liquefaction of solid polymerizable organic materials, if appropriate with the addition of suitable solvents, in the dark or under red or yellow light, heating to temperatures above their glass transition temperature, the addition of components (b) and (c) and cooling of the mixtures formed. If desired, the resulting glass-like products can be obtained, for example, by mixing glass-like polymerizable materials in powder form with components (b) and (c).

The compositions according to the invention are stable, and thus capable of being stored, at room temperature and under yellow light conditions. They can be hardened directly by the action of heat, advantageously at temperatures near the melting point or decomposition point of components b) and c). They have a high photosensitivity and at the same time are stable to yellow light in the case of sensitizers which absorb light in the region below 500 nm.

The present invention thus relates also to a process for the polymerization of an organic material polymerizable by free radical polymerization, under the action of radiation, in the presence of a photoinitiator and, if appropriate, with heating, wherein the photoinitiator is a mixture of (a) at least one iron compound of the formula I

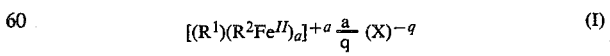

wherein a is 1 or 2 and q is 1, 2 or 3,

X is halogen, nitrate, sulfate, phosphate, perchlorate or (LQm),

L is a divalent to heptavalent metal or non-metal,

Q is a halogen atom, m is an integer corresponding to the sum of the values of L and q, $R^1$ is an integer corresponding to the sum of the values of L and q, $R^1$ is an unsubstituted or substituted $\eta^6$-benzene and $R^2$ is an unsubstituted or substituted cyclopentadienyl anion, (b) at least one α-cleavage or homolytic bond cleavage sensltizer for the compound of the formula I and, if appropriate, the polymerization reaction is then completed by the application of heat.

These hardenable mixtures are advantageously irradiated with electron beams or actinic light, preferably having a wavelenth of 200 to 600 nm and an intensity of 150 to 5000 Watts. Examples of suitable light sources are xenon lamps, argon lamps, tungsten lamps, carbon arcs, metal halide lamps and metal arc lamps such as low-pressure, medium-pressure and high-pressure mercury discharge lamps. The irradiation is preferably carried out with metal halide lamps or high-pressure mercury discharge lamps. Solar radiation sources are also applicable including sunlight and phosphorescence discharge lamps (fluorescent lamps). The irradiation time depends on a variety of factors including, for example, the polymerizable organic material, the type of light source and its distance from the material irradiated. The irradiation time is preferably 10 to 60 seconds.

The exposed compositions can be heated in conventional convection ovens. If short heating or reaction times are required, the heating can be effected by exposure with, for example, IR radiation, IR lasers or microwave devices. The polymerization temperatures are in the range from room temperature to about 80° C.

The compositions according to the invention can also contain other known additives normally used in the technology of photopolymerizable materials. Examples of these additives are pigments, dyes, fillers and reinforcements, glass fibers and other fibers, flame retardants, antistatic agents, flow control agents, antioxidants and light stabilizers, as well as conventional photoinitiators such as acetophenones or aromatic ketones. To improve the final properties of epoxy resins, it is possible to incorporate polyfunctional hydroxyl compounds, for example, those described in German Offenlegungsschrift No. 26 39 395.

To increase the storage stability in the dark, the hardenable compositions can contain weak organic bases such as nitriles, amides, lactones or urea derivatives. To prevent premature reaction through unintentional exposure, small quantities of UV absorbers and/or organic dyes can be added.

The composition according to the invention can be applied by usual methods to at least one surface of a substrate. The coated material also forms a subject of the invention. Examples of suitable substrates are metals and metalloids, such as steel, aluminium, copper, cadmium, zinc and silicon, as well as ceramic, glass, plastics, paper and wood. The coated material can be used to prepare protective layers and passivating layers by exposure, and this forms a further subject of the invention.

If, on exposure, only part of the coating is irradiated through a photomask, the unexposed areas can subsequently be removed with a suitable solvent. In the case where a liquid photopolymer has been exposed in an imagewise fashion, the resulting non-polymerized region may be removed by hot air or other simplified means. Thus, the coated material is also suitable as a photographic recording material, for the production of printing plates and particularly printed circuits, as a solder resist, as liquid or dry film photo resists and etch resists. The use as a photographic recording material also forms a subject of the present invention.

The subject blends of photoinitiators greatly improve the light sensitivity of compositions useful for a variety of imaging systems such as printing plates, (those forming relief imaging such as in letterpress and flexography), photoresists, formation of color images such as proofing films, imaging systems utilizing microencapsulation (U.S. Pat. No. 4,482,624), and applications where greater sensitivity to visible light is required. For example, in most applications, one can add more photoinitiator to obtain greater speed, i.e., 2–4% versus 1% used in most printing plates. However, in printing plates, higher photoinitiator levels result in poorer resolution, i.e., by having too much photoinitiator present, screening prevents light from curing down to the bottom of the plate and many fine imaging details such as small dots are lost during the development process. By extending the sensitivity to longer wavelengths, the subject blend of photoinitiators cures the resin more quickly, and yet allows the ultraviolet rays to pass into the lower regions in order to have adequate through cure at the substance.

By way of illustration, the following procedure can be utilized in order to produce printing plates with the instant photoinitiator blends.

Approximately 50 mils of photopolymer including the photoinitiator blend are drawn down on a black painted aluminum sheet and then given a preliminary exposure to increase the viscosity and presumably reduce the concentration of oxygen, thus improving the sensitivity of the photopolymer. In commercial application, this BUMP is applied by a low pressure mercury lamp such as a black light. A predetermined period of exposure to a pulsed Xenon Arc lamp which is columnated using a series of dichroic mirrors, suspended approximately two meters above the printing plate in order to columnate the radiation, may also be utilized. A negative is held to a plate glass (usually Pyrex) platen by a vacuum system and lowered into position over the photopolymer. Generally, a 15–20 mil air gap exists such that the polymer does not contact (and thus destroy) the negative used to form the image. Next, the Xenon lamp is again turned on for about 35–55 seconds for the main exposure. Following the imaging exposure, the photopolymer has generated a semi-rigid image where radiation has passed through the negative. However, cure does not occur on the surface but rather only about 50% or 20–25 mils of the polymer are actually solidified. The remainder resides as a puddle on the top of the printing plate. This fluid portion is blown off with a high velocity hot air knife and recirculated into the virgin polymer. The final steps are to pass the plate in contact with a smooth blotting paper to pick up any liquid residue. Next it is passed under a high intensity focused lamp which results in the post cure, bringing the plate to its final hardness.

The following examples illustrate the embodiments of this invention. In these examples, all parts given are by weight unless otherwise specified.

The following compounds are utilized in these examples:

A—($\eta^6$-isopropylbenzene)($\eta^5$-cyclopentadienyl) iron (II) hexafluorophosphate B—2,2-dimethoxy-2-phenylacetophenone C—2,2-diethoxy-2-phenylacetophenone D—2,2-dimethyl-2-hydroxyacetophenone
E—1-hydroxycyclohexyl phenyl ketone

EXAMPLE 1

The example illustrates the improvement in imaging speed provided by the instant systems.

A solution of 25 grams of the indicated free radical polymerizable material and the indicated amounts of compounds A and B is prepared and drawn in a 50 mil coating on a non-reflective black paper substrate. The coating is then covered with a step wedge (0.05 D/step—6 steps=2x increase in speed), there being a 20 mil air gap between the negative and the coated substrate. The coated systems are then exposed at 160 millijoules/sq. cm. utilizing a stationary mercury bulb lamp curing unit. The point at which a skin of polymer begins to form is judged to be the sensitivity of the formulation, this point being defined as a "skin point" which is determined by the step under which polymer gel is formed (higher step number=more sensitive=faster imaging speed).

The test results are noted in the following table:

| Photoinitiator System (%, by weight) | | Relative Imaging Speed (steps) Photopolymerizable Material* | | | |
|---|---|---|---|---|---|
| A | B | 1 | 2 | 3 | 4 |
| 0 | 1 | 7.5 | 10 | 6 | 9 |
| 1 | 0 | 6.5 | 6 | 6 | 15 |
| 0 | 2 | 9.0 | 13 | 10 | 13 |
| 1 | 1 | 13.0 | 15 | 14 | 24 |
| 1 | 2 | — | G | 18 | 22 |
| 2 | 1 | 16.5 | G | 14 | 27 |
| 3 | 1 | 17.0 | G | G | G |

*1 - Epoxy acrylate (Cellrad 6700 from Celanese Plastics and Specialties Co.)
2 - Acrylated urethane (Uvethane 893 from Morton Thiokol)
3 - Acrylated urethane (Cargill 1512 from Cargill, Inc.)
4 - Acrylated urethane (Cargill 1522 from Cargill, Inc.)
G - sample gelled before testing due to storage in brown glass jar under white fluorescent lighting These results thus indicate the faster imaging speed of the systems of the instant invention. In addition, the sensitivity to white light is demonstrated by the gellation of samples where the fluorescent room light is filtered through brown glass.

EXAMPLE 2

In order to simulate the preparation of a flexographic printing plate, a procedure was used as described in Hercules' Publication No. 24882, the Operating Manual for the Merigraph Type 32 Device (plate making exposure machine). A negative (50 step wedge), cover film, photopolymer and polyester backup films are sandwiched between two 0.64 cm glass plates. Spacers set the thickness of photopolymer to be 72 mils ±1 mil. No airgap remains between the negative and the photopolymer. Exposure through the back (floor) for 0.2 minutes is followed by imagewise exposure through the front for 0.45 minutes. Development wash for 5-7 minutes in ultrasonic bath containing 2 parts isopropanol and 1 part acetone is then followed by 4 minutes post exposure to cure the tacky surface. (Evaluation as per Example 1)

The results are noted in the following table:

| Photoinitiator System (%, by weight) | | Imaging Speed (steps) Photopolymerizable Material* | | | |
|---|---|---|---|---|---|
| A | B | 5 | 2 | 3 | 4 |
| 1 | 1 | 4 | 4 | 4 | 3 |
| 0 | 2 | 5 | 4 | 4 | 4 |
| 0 | 1 | 5+ | 4 | 4 | 4 |
| 0 | 5 | 6 | — | — | — |
| 1 | 0 | 6+ | — | — | 9 |

*5 - 90% Acrylated and Methacrylated Urethane (Radcure Specialties IRR-28) + 10% Isodecyl Acrylate

EXAMPLE 3

A 50 mil (wet) film of a methacrylate-functional urethane (W. R. Grace) including photoinitiators is drawn down on jet black glossy paper (non-reflecting) substrate. A Kodak 50 step wedge, laminated to glass, is suspended 15 mils above the coating surface. A 5 kw high pressure mercury lamp is used for image wise exposure of 160 millijoules/sq. cm. The skin point is determined as in Example 1.

| Photoinitiator System (%, by weight) | | | | Imaging Speed (steps) |
|---|---|---|---|---|
| A | B | C | D | |
| 0 | 1 | — | — | 19 |
| 1 | 1 | — | — | 22 |
| 0 | — | 1 | — | 16 |
| 1 | — | 1 | — | 20 |
| 0 | — | — | 1 | 5 |
| 1 | — | — | 1 | 15 |
| 1 | — | — | — | 0 |

EXAMPLE 4

A 40 mil film of the indicated photopolymer is drawn down on white cardboard. A two step imaging procedure is used to crosslink the photopolymer simulating the commercial preparation of letterpress printing plates from liquid photopolymer. First, the coating is pre-exposed to 130 millijoules exposure from an unfiltered 5 kw high pressure mercury lamp. This results in increased viscosity, but not gellation. Then, a 50 step nagative is placed over the coating as described in Example 3. Imagewise exposure of 270 millijoules/sq. cm. results in the formation of crosslinked "skin". The skin point is determined as in Example 1.

| Photoinitiator System (%, by weight) | | Imaging Speed (Steps) Photopolymerizable System | | | |
|---|---|---|---|---|---|
| A | B | 1 | 2 | 3 | 4 |
| 0 | 1 | <0* | 1 | 0 | 0 |
| 1 | 1 | 9 | 12 | 15 | 50 |

*<0 - no skin formed

EXAMPLE 5

This example illustrates the preparation of printing plates utilizing the photoinitiator systems of this invention.

The printing plate preparative procedure set forth hereinabove and identified as an "illustration" is utilized in this example. The photopolymer utilized is a methacrylate-modified aliphatic urethane. The photoinitiator blends identified in the table are present in the photopolymer. The length of the preliminary exposure (BUMP) is also listed in the table with this exposure being provided by the indicated Xenon Arc lamp.

The negative, i.e. target, is supplied as a lith quality negative with combinations of line density and various half-tone dots on a semi-circular step wedge scale ranging from 27 (largest dot size) to 1 containing the smallest dot size which will produce the finest dots on a printing plate. Dots produced in the 15-20 range represent shadow detail and dots produced from the 1-5 range represent highlight features in the printing of an image or photograph. The period of exposure is also listed in the table.

The follow procedures are utilized to evaluate the products.

Gel Point

The gel point is determined as the amount of exposure (without negative or glass plate) needed to viscosify the polymer such that it begins to form a gelatinous thread when lifted with a small probe.

Crossover Point (XPT)

The crossover point is what appears to be a diffraction pattern which is read on a semi-circular half-tone region numbered 1-27 on a Gammatrol target. This image appears on the plate where the edges of the dots begin to touch and thus a diagonal interference-like reflection is generated. An optimum plate has this crossover effect which is by definition a 50% dot at between 16 and 17, using the Gammatrol step wedge number. The change in crossover point may be used as a parameter to measure speed, as shifting to lower numbers means one has achieved the same size dots with less light exposure (since less light penetrates through the small dot).

Fine Dot

This parameter measures the finest (smallest) dots which are held during the manufacture of the photopolymer plate. A 2 or possibly 3 on the Gammatrol scale is generally considered an acceptable commercial quality. A 1 is judged to be an exceptionally good quality plate. Loss of fine dot occurs when the shape of the dots are poor, having little or no shoulder. Undercutting, such that the dots are removed during the development process, or stand on a pedestal like a mushroom, is also undesirable.

The various parameters are noted in the following table

| Photoinitiator System (%, by weight) | | BUMP (sec.) | Exposure (sec.) | Gel Point | XPt. | Fine Dot |
| A | B | | | | | |
| --- | --- | --- | --- | --- | --- | --- |
| 1 | 0 | 1.5 | 55 | 3.0 | | no through cure |
| 0 | 1 | 0.5 | 55 | 1.0 | 16.5 | 8 |
| 0 | 2 | 0.2 | 45 | 0.4 | 24 | 15 |
| 0.1 | 0.5 | 0.8 | 55 | 1.7 | 14 | 2-3 |
| 1 | 1 | 0.2 | 55 | 0.4 | <1 | 1 |
| 1 | 1 | 0.2 | 45 | 0.4 | 8 | 1 |
| 1 | 1 | 0.2 | 35 | 0.4 | 6 | 2 |
| 1 | 1 | 0 | 35 | 0.4 | 17 | 8 |
| 0.5 | 0.5 | 1.0 | 55 | 2.0 | 11 | 5 |

These data further confirm the high activity of the systems of the instant invention.

EXAMPLE 6

The following photopolymer is formulated by mixing the indicated components.

| | %, by weight |
| --- | --- |
| Water washable urethane acrylate resin* | 80 |
| Polyethylene glycol dimethacrylate | 15 |
| N—vinyl pyrrolidone | 5 |

*Chempol 19-4867 from Radcure Specialties

The photopolymer is exposed imagewise as in Example 3 for a total exposure of 442 millijoules/cm². The skin point is measured as in Example 1 with the following results.

| Photoinitiator System (%, by weight) | | Imaging Speed (steps) |
| A | E | |
| --- | --- | --- |
| 0.2 | 0.2 | 3 |
| 0.2 | 1.0 | 10 |
| 1.0 | 1.0 | 15 |
| 2.0 | 2.0 | 20 |
| 0 | 1.0 | 5 |
| 0 | 2.0 | 8 |
| 0 | 0 | 0 |

Summarizing, it is seen that this invention provides effective photoinitiator blends for use in free radical polymerizable systems. Variations may be made in procedures, proportions and materials without departing from the scope of the invention as defined by the following claims.

What is claimed is:
1. A composition comprising
   (a) a material polymerizable by free radical polymerization,
   (b) at least one iron compound of the formula I

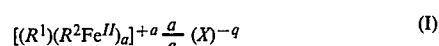

$$[(R^1)(R^2Fe^{II})_a]^{+a}\frac{a}{q}(X)^{-q} \quad (I)$$

wherein
   a is 1 or 2 and q is 1, 2 or 3,
   X is halogen, nitrate, sulfate, phosphate, perchlorate or (LQ$_m$),
   L is a divalent to heptavalent metal or non-metal,
   Q is a halogen atom,
   m is an integer corresponding to the sum of the values of L and q,
   R$^1$ is an unsubstituted or substituted $\eta^6$-benzene and R$^2$ is an unsubstituted or substituted cyclopentadienyl anion,
and
   (c) a non-oniun α-cleavage photoinitiator; said components (b) and (c) being present in a combined concentration of from about 0.05-10.0%, by weight of (a), and in weight ratios ranging from 6:1 to 1:4.

2. The composition according to claim 1, wherein said components (b) and (c) are present in a combined concentration of 0.2-2.5%, by weight of (a).

3. The composition according to claim 1, wherein said components (b) and (c) are present in a combined concentration of 2.0%, by weight of (a), and in a 1:1 weight ratio.

4. The composition according to claim 1, wherein $R^1$ is monosubstituted or polysubstituted by identical or different halogen atoms or $C_1$-$C_{12}$-alkyl, $C_2$-$C_{12}$-alkenyl, $C_2$-$C_{12}$-alkynyl, $C_1$-$C_8$-alkoxy, cyano, $C_1$-$C_8$-alkylthio, $C_2$-$C_6$-monocarboxylic acid ester, phenyl, $C_2$-$C_5$-alkanoyl or benzoyl.

5. The composition according to claim 1, wherein $R^2$ is monosubstituted or polysubstituted by identical or different $C_1$-$C_8$-alkyl, $C_2$-$C_8$-alkenyl, $C_2$-$C_8$-alkynyl, $C_2$-$C_6$-monocarboxylic acid ester, cyano, $C_2$-$C_5$-alkanoyl or benzoyl.

6. The composition according to claim 1, wherein a is 1.

7. The composition according to claim 1, wherein m is 4 or 6, L is B, P, As or Sb, Q is F and q is 1.

8. The composition according to claim 1, wherein $R^1$ is benzene, toluene, xylene, cumene, mesitylene, chlorobenzene, chlorotoluene, anisole, dimethoxybenzene, biphenyl, dodecylbenzene or tetralin.

9. The composition according to claim 1, wherein $R^2$ is the cyclopentadienyl or methylcyclopentadienyl anion.

10. The composition according to claim 1, wherein said iron compound is ($\eta^6$-isopropylbenzene) ($\eta^5$-cyclopentadienyl) iron (II) hexafluorophosphate.

11. The composition according to claim 1, wherein said $\alpha$-cleavage photoinitiator is selected from the group consisting of acetophenones, ketals, aryl glyoxalates, acylphosphine oxides.

12. The composition of claim 11 wherein said $\alpha$-cleavage photoinitiator corresponds to the formula

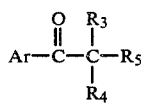

wherein Ar is $C_6$-$C_{14}$ aryl which is unsubstituted or substituted by halogen, CN, OH, $C_1$-$C_{12}$ alkyl, —Oalk, —Ophenyl, —Salk, —SCH$_2$CH$_2$OH, —Sphenyl, —SO$_2$alk, —SO$_2$phenyl, —COOalk, —SO$_2$NH$_2$, —SO$_2$NHalk, —SO$_2$N(alk)$_2$, —NHalk, —N(alk)$_2$, —NHCOalk or —NHCO-phenyl, or represents thienyl, pyridyl, furyl, indanyl or tetrahydronaphthyl, and alk represents a lower alkyl radical of 1 to 4 carbon atoms, $R_3$ is OH, $C_1$-$C_8$ alkyl which is unsubstituted or substituted by —OH, Oalk, $C_2$-$C_8$acyloxy, —COOalk or =CN, or is $C_3$-$C_4$alkenyl, $C_5$-$C_6$cycloalkyl, $C_7$-$C_9$phenylalkyl, or —OR$_6$ wherein R$_6$ is $C_6$ aryl or $C_1$-$C_6$ alkyl which is unsubstituted or substituted by —OH, Oalk, $C_2$-$C_8$ acyloxy, —COOalk, —CN or phenyl; and $R_4$ has one of the meanings assigned to $R_3$, $C_2$-$C_8$alkenylene or together with $R_3$ represents $C_2$-$C_8$alkylene or $C_3$-$C_9$oxa- or azaalkylene; and $R_5$ is hydrogen, OH, $C_1$-$C_8$ alkyl, $C_6$-$C_{14}$ aryl, $C_5$-$C_8$-cycloalkyl or morpholino.

13. The composition of claim 12, wherein $R_3$ and $R_4$ are —OR$_6$, $R_5$ is phenyl and $R_6$ is $C_1$-$C_4$ alkyl, or $R_3$ and $R_4$ combine to form $C_2$-$C_8$ alkylene and $R_5$ is OH or phenyl.

14. The composition of claim 12, wherein said photoinitiator is 2,2-dimethoxy-2-phenylacetophenone, 2,2-diethoxy-2-phenylacetophenone, 2,2-dimethyl-2-hydroxyacetophenone or 1-hydroxycyclohexyl phenyl ketone.

15. The composition of claim 14, wherein said photoinitiator is 2,2-dimethoxy-2-phenylacetophenone.

16. The composition of claim 14, wherein said photoinitiator is 1-hydroxycyclohexyl phenyl ketone.

17. The composition of claim 1, wherein components (b) and (c) are present in respective concentrations of 1.0%, by weight of (a) and are ($\eta^6$-isopropylbenzene) ($\eta^5$-cyclopentadienyl)iron (II) hexafluorophosphate and 2,2-dimethoxy-2-phenylacetophenone, respectively.

18. The composition according to claim 1, wherein the material polymerizable by free radical polymerization is a monoethylenically or polyethylenically unsaturated compound.

19. The composition according to claim 18, wherein the material polymerizable by free radical polymerization is a partial ester of an epoxy resin and acrylic acid, methacrylic acid or a mixture of the acids, or an acrylic acid ester or methacrylic acid ester of a polyol.

20. A coated material wherein a layer of the composition according to claim 1 is applied to at least one surface of a substrate.

21. A coated material wherein a layer of the composition according to claim 17 is applied to at least one surface of a substrate.

22. A process for the production of photographic relief images, wherein a material according to claim 20 is irradiated through a photomask, and the unexposed parts are then removed.

23. A process for the production of photographic relief images, wherein a material according to claim 21 is irradiated through a photomask, and the unexposed parts are then removed.

24. A process for the polymerization of a material polymerizable by free radical polymerization, under the action of radiation, in the presence of a photoinitiator which comprises a mixture of (b) at least one iron compound of the formula I

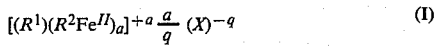

wherein
a is 1 or 2 and q is 1, 2 or 3,
X is halogen, nitrate, sulfate, phosphate, perchlorate or (LQm)
L is a divalent to heptavalent metal or non-metal,
Q is a halogen atom,
m is an integer corresponding to the sum of the values of L and q,
$R^1$ is an unsubstituted or substituted $\eta^6$-benzene and
$R^2$ is an unsubstituted or substituted cyclopentadienyl anion, and
(c) a non-onium $\alpha$-cleavage photoinitiator; said components (b) and (c) being present in a combined concentration of from about 0.05–10.0%, by weight of said polymerizable material, and in weight ratios ranging from 6:1 to 1:4.

25. The process of claim 24, wherein component (c) corresponds to the formula

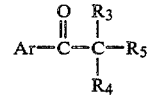

wherein Ar is $C_6$-$C_{14}$ aryl which is unsubstituted or substituted by halogen, CN, OH, $C_1$-$C_{12}$ alkyl, —Oalk, —Ophenyl, —Salk, —SCH$_2$CH$_2$OH, —Sphenyl, —SO$_2$alk, —SO$_2$phenyl, —COOalk, —SO$_2$NH$_2$, —SO$_2$NHalk, —SO$_2$N(alk)$_2$, —NHalk, —N(alk)$_2$, —NHCOalk or —NHCO-phenyl, or represents thienyl, pyridyl, furyl, indanyl or tetrahydronaphthyl, and alk represents a lower alkyl radical of 1 to 4 carbon atoms, $R_3$ is OH, $C_1$-$C_8$ alkyl which is unsubstituted or substituted by —OH, Oalk, $C_2$-$C_8$acyloxy, —COOalk or —CN, or is $C_3$-$C_4$alkenyl, $C_5$-$C_6$cycloalkyl, $C_7$-$C_9$phenylalkyl, or —OR$_6$ wherein R$_6$ is $C_6$ aryl or $C_1$-$C_8$ alkyl which is unsubstituted or substituted by —OH, Oalk, $C_2$-$C_8$ acyloxy, —COOalk, —CN or phenyl; and $R_4$ has one of the meanings assigned to $R_3$, $C_2$-$C_8$alkenylene or together with $R_3$ represents $C_2$-$C_8$alkylene or $C_3$-$C_9$oxa- or azaalkylene; and $R_5$ is hydrogen, OH, $C_1$-$C_8$ alkyl, $C_6$-$C_{14}$ aryl, $C_5$-$C_8$ cycloalkyl or morpholino.

26. The process of claim 25, wherein components (b) and (c) are present in respective concentrations of 1.0%, by weight of said polymerizable material and are ($\eta^6$-isopropylbenzene)($\eta^5$-cyclopentadienyl) iron (II) hexafluorophosphate and 2,2-dimethoxy-2-phenylacetophenone, respectively.

* * * * *